(12) United States Patent
Huang et al.

(10) Patent No.: US 9,258,885 B2
(45) Date of Patent: Feb. 9, 2016

(54) PCB BACK DRILL DETECTION METHOD AND PCB PLATING

(71) Applicants: Peking University Founder Group Co., Ltd., Beijing (CN); Zhuhai Founder Tech Hi-Density Electronic Co Ltd., Guangdong Province (CN)

(72) Inventors: Shiqing Huang, Guangdong Province (CN); Jinhong Li, Guangdong Province (CN); Xianren Chen, Guangdong Province (CN)

(73) Assignees: ZHUHAI FOUNDER TECH HI-DENSITY ELECTRONIC CO LTD., Guangdong Province (CN); PEKING UNIVERSITY FOUNDER GROUP CO., LTD., Beijing (CN)

( * ) Notice: Subject to any disclaimer, the term of this patent is extended or adjusted under 35 U.S.C. 154(b) by 0 days.

(21) Appl. No.: 14/123,082

(22) PCT Filed: Oct. 29, 2012

(86) PCT No.: PCT/CN2012/083691
§ 371 (c)(1),
(2) Date: May 12, 2015

(87) PCT Pub. No.: WO2013/064048
PCT Pub. Date: May 10, 2013

(65) Prior Publication Data
US 2015/0264804 A1 Sep. 17, 2015

(30) Foreign Application Priority Data
Nov. 3, 2011 (CN) .......................... 2011 1 0343983

(51) Int. Cl.
*H05K 1/11* (2006.01)
*B23P 19/04* (2006.01)
(Continued)

(52) U.S. Cl.
CPC ............ *H05K 1/0237* (2013.01); *H05K 1/0216* (2013.01); *H05K 1/0268* (2013.01);
(Continued)

(58) Field of Classification Search
CPC ... H05K 3/0047; H05K 1/0268; H05K 1/115; H05K 2203/0207; H05K 2203/0242; H05K 2201/09781; Y10T 29/49155; Y10T 29/49156
USPC .............. 174/262–266; 29/402.06, 847, 852
See application file for complete search history.

(56) References Cited

U.S. PATENT DOCUMENTS

| | | | | |
|---|---|---|---|---|
| 7,669,321 | B1 * | 3/2010 | Levy | H05K 1/0268 174/260 |
| 2006/0090933 | A1 * | 5/2006 | Wig | H05K 1/0216 174/262 |
| 2008/0217051 | A1 * | 9/2008 | Matsui | H05K 1/0269 174/266 |
| 2008/0217052 | A1 | 9/2008 | Matsui | |

(Continued)

FOREIGN PATENT DOCUMENTS

| | | |
|---|---|---|
| CN | 101876687 A | 11/2010 |
| CN | 201828238 U | 5/2011 |

OTHER PUBLICATIONS

PCT/CN2012/083691 English translation of the International Search Report mailed Jan. 24, 2013, 3 pages.
(Continued)

*Primary Examiner* — Sherman Ng
(74) *Attorney, Agent, or Firm* — Lathrop & Gage LLP

(57) ABSTRACT

A method for detecting back-drilled holes in a PCB and a PCB panel are provided. The method comprises: forming, on a metal layer of a first inner layer of a multi-layer PCB, metal rings according to positions of the back-drilled holes during a process of forming the PCB, wherein each of the formed metal rings has an outer diameter greater than an aperture of each of the back-drilled holes; forming, at positions corresponding to the positions of the back-drilled holes, metal holes extending through an outer layer of the PCB and the formed metal rings; forming two first detection holes electrically connected with the formed metal rings; forming the back-drilling holes on the PCB, which extend through and expand the metal holes; and detecting an electrical conduction between the two first detection holes so as to determine whether a position offset exists between the back-drilled holes and the metal holes.

12 Claims, 3 Drawing Sheets

(51) Int. Cl.
*H05K 3/02* (2006.01)
*H01K 3/10* (2006.01)
*H05K 1/02* (2006.01)
*H05K 3/00* (2006.01)
*G01R 31/28* (2006.01)

(52) U.S. Cl.
CPC ............ *H05K 1/115* (2013.01); *H05K 3/0047* (2013.01); *G01R 31/2805* (2013.01); *H05K 2201/09781* (2013.01); *H05K 2203/0207* (2013.01); *H05K 2203/0242* (2013.01); *Y10T 29/49155* (2015.01); *Y10T 408/03* (2015.01)

(56) References Cited

U.S. PATENT DOCUMENTS

| | | | | |
|---|---|---|---|---|
| 2009/0166080 | A1* | 7/2009 | Matsui | H05K 3/4623 174/266 |
| 2011/0240348 | A1* | 10/2011 | Lau | H05K 1/0251 174/257 |
| 2012/0302075 | A1* | 11/2012 | Muraoka | H05K 1/0251 439/78 |

OTHER PUBLICATIONS

PCT/CN2012/083691 English translation of the Written Opinion of the International Searching Authority mailed Jan. 24, 2013, 5 pages.

\* cited by examiner

PCB BACK DRILL DETECTION METHOD AND PCB PLATING

TECHNICAL FIELD

The present application relates to a manufacturing technology field of a Printed Circuit Board (PCB), in particular, to a method for detecting a back-drilled hole in a PCB and to a PCB panel.

BACKGROUND

With the multi-functionalized, miniaturized and high-performance development of electronic products, the PCB is required to be developed with a higher level, a higher density and higher signal integrity. As such, to have the higher level and higher density, it requires that the PCB should be drilled in very high accuracy. Further, to have the higher signal integrity, it is necessary to reduce sources of signal noise as little as possible.

Currently, the signal integrity, especially, the integrity of high-frequency (HF) signal, is improved by back-drilling the PCB. The back-drilling removes extra metal from a metal hole in the PCB so as to reduce signal reflection caused by the extra metal and thus reduce the signal noise. In order to remove extra metal from the metal hole, a back-drilled hole must have an aperture greater than an outer diameter of the metal hole in the PCB. While removing the extra metal from the metal hole, it is further necessary to prevent damage to metal patterns around the metal hole for transmitting signal.

In related technologies, an alignment between the back-drilled hole and the metal hole in the PCB is detected by a way of slicing. In this way, the PCB under the detection may be scrapped, and the detecting cost is relatively high.

SUMMARY

The present application is proposed to provide a method for detecting back-drilled holes in the PCB and to provide a PCB panel to resolve the above-mentioned problems of the scrapped PCB by detecting alignment between the back-drilled hole and the metal hole by means of slicing in the related technologies.

In an embodiment of the present application, a method for detecting back-drilled holes in a PCB, comprising:

forming, on a metal layer of a first inner layer of a multi-layer PCB, a metal ring according to a position of a back-drilled hole to be formed during a process of forming the PCB, wherein the formed metal ring has an outer diameter greater than an aperture of the back-drilled hole to be formed;

forming, at position corresponding to the position of the back-drilled hole to be formed, a metal hole extending through an outer layer of the PCB and the formed metal ring;

forming two first detection holes electrically connected with the formed metal ring;

forming the back-drilling hole on the PCB, which extends into and expand the metal hole; and detecting an electrical conduction between the two first detection holes so as to determine whether a position offset exists between the back-drilled hole and the metal hole.

Preferably, the method further comprises:

forming, on a metal layer of a third inner layer, a second bonding pad during the process of forming the multi-layer PCB, wherein the third inner layer is inside of the first inner layer in a direction of back-drilling, and the formed second bonding pad has a diameter between apertures of the metal hole and the back-drilled hole;

forming two third detection holes electrically connected with the second bonding pads;

after forming the back-drilled hole, if said two third detection holes are detected to be electrically conductive, it will be determined that depth of the back-drilled hole meets requirements; otherwise, it will be determined that the depth of the back-drilled does not meet requirements.

Preferably, the method further comprises:

forming, on a metal layer on a second inner layer between the first inner layer and the third inner layer, a first bonding pad having a diameter between apertures of the metal hole and the back-drilled hole during the process of forming the multi-layer PCB, wherein position of the formed first bonding pad correspond to that of the metal hole;

forming two second detection holes electrically connected with the first bonding pads;

after forming the back-drilled hole, if the electrical break between the two second detection holes is detected, it will be determined the depth of the back-drilled hole extends beyond the second inner layer; otherwise it will be determined the depth of the back-drilled hole does not extend beyond the second inner layer.

Preferably, a plurality of metal rings electrically connected with each other are formed, the number and positions of the metal rings formed on the first inner layer are corresponding to those of the metal hole, respectively, the metal rings are connected in series, and the first and last of the metal rings are electrically connected with one of the first detection holes, respectively.

In another embodiment of the present application, a PCB panel having back-drilled holes is provided, including:

an outer layer and a first inner layer;

at least one metal hole, at least one metal ring, and two first detection holes, wherein the metal hole extends through the outer layer and the first inner layer of the PCB panel;

the back-drilled hole is generated by expanding the metal hole and extends into the outer layer and the first inner layer;

the metal ring is arranged on the first inner layer, and has a position corresponding to that of the back-drilled hole and has an outer diameter greater than the aperture of the back-drilled hole; and the first detection holes are arranged to detect alignments between the back-drilled hole and the metal hole, and electrically connected with the metal ring, and wherein the alignments between the back-drilled hole and the metal hole meet requirements if the two first detection holes are electrically conductive.

Preferably, the first detection holes are disposed on the outer layer of the PCB panel.

Preferably, the difference between an outer diameter of the metal ring and a radius of the back-drilled hole is not greater than 6 mil, and the metal ring has a width not greater than 3 mil.

Preferably, the PCB panel further includes a third inner layer, a second bonding pad attached to a metal layer on the third inner layer, and two third detection holes, wherein, the third inner layer is disposed on an inside of the first inner layer in the direction of back-drilling;

the second bonding pad has a position corresponding to that of the back-drilled hole, and a diameter between apertures of the metal hole and the back-drilled hole;

the metal hole extends through the third inner layer; and the third detection holes are arranged to detect a depth of the back-drilled hole, and electrically connected with the second bonding pad, wherein the depth of the back-drilled hole meets requirements if the two third detection holes are electrically conductive.

Preferably, wherein a plurality of metal rings are provided, which are electrically connected with each other, the number and positions of the metal rings formed on the first inner layer are corresponding to those of the metal hole, the metal rings are electrically connected in series, and the first and last of the metal holes are electrically connected with the two first detection holes, respectively.

Preferably, the difference between a radius of the second bonding pad and a radius of the metal hole is not greater than 4 mil; and the difference between a radius of the second bonding pad and a radius of the metal hole is not greater than 4 mil.

In view of the above, in the embodiments of the present application, the metal rings are formed according to the positions of the back-drilled holes. After the back-drilled holes are formed, it is determined whether the position of the back-drilled hole is aligned with that of the metal hole by detecting the two first detection holes are electrically conductive or not. The detection process causes little damage to the PCB and does not affect the subsequently normal use of the PCB. In addition, the cost for detection is reduced.

BRIEF DESCRIPTION OF THE FIGURES

The present application is further discussed with reference to accompanying figures, which constitute a part of the disclosure. Exemplary embodiments of the present application and illustrations thereof intend to explain the present invention, but, however, shall not be considered inappropriately as limitations to the present invention.

DETAILED DESCRIPTION

Hereafter, the present application is discussed in detail with reference to the accompanying figures in combination with embodiments.

Figure 1:
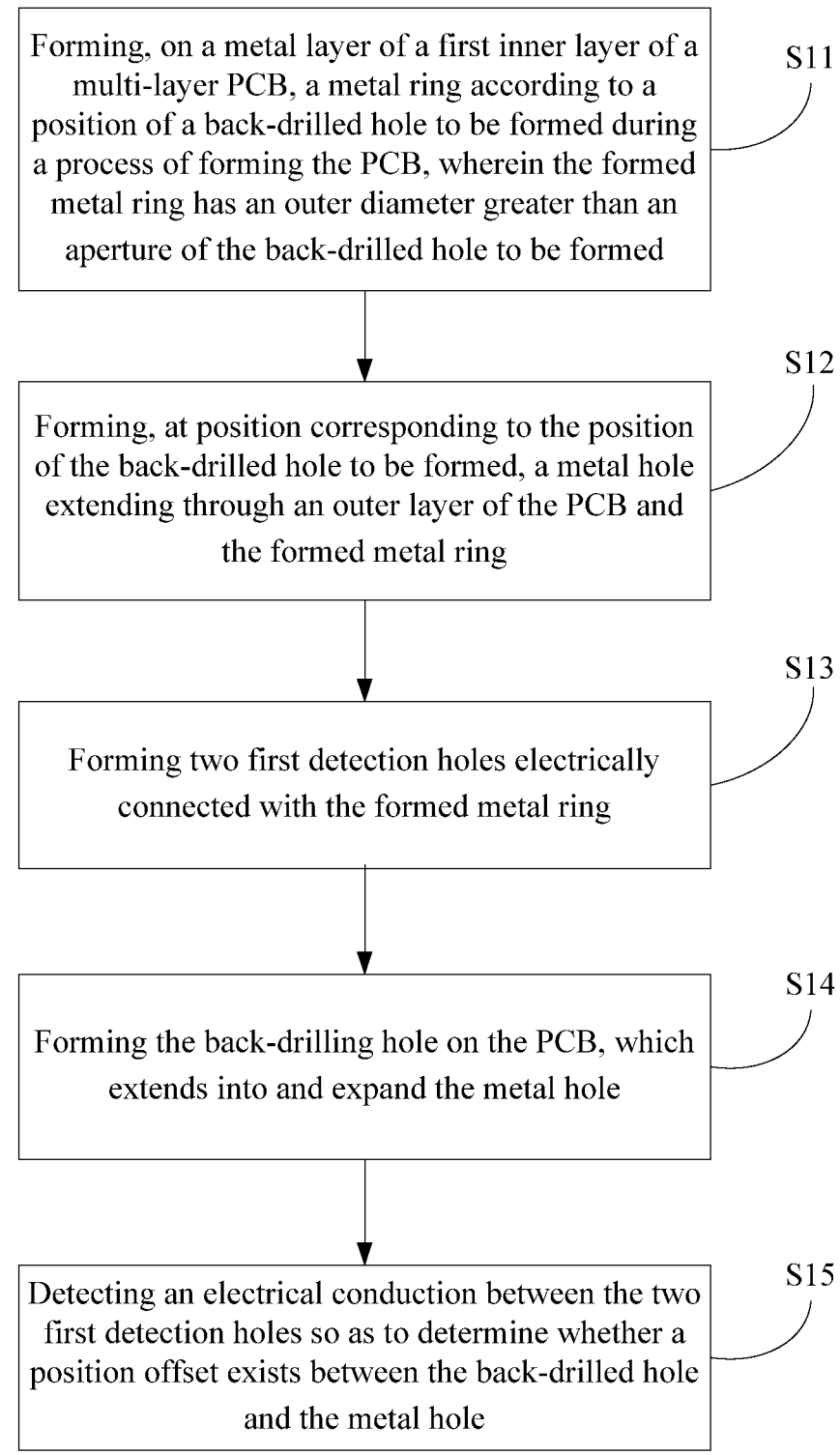
FIG. 1 shows a flow chart according to embodiments of the present application.

With reference to FIG. 1, a basic embodiment of a method for forming a multi-layer PCB includes the following steps.

At step S11, in the process of forming the multi-layer PCB, a metal ring with an outer diameter greater than aperture of a back-drilled hole is formed on a metal layer of a first inner layer of the PCB, according to position of the back-drilled hole.

At step S12, at a position corresponding to that of the back-drilled hole, a metal hole is formed to extend through an outer layer of the PCB and the metal ring on the first inner layer.

At step S13, two first detection holes, each of which is electrically connected with the metal ring, are formed.

At step S14, the back-drilled hole is formed in the PCB to extend along and to expand the metal hole.

At step S15, the electrical conduction between these two first detection holes is detected to determine whether or not a position offset exists between the back-drilled hole and the metal hole.

In an embodiment of the present application, the metal ring is formed based on the position of the back-drilled hole. After the back-drilled hole is drilled, it is judged whether the position of the back-drilled hole is aligned with that of the metal hole by detecting the electrical conduction between the two first detection holes. The detecting process causes little damage to the PCB and does not affect the subsequently normal use of the PCB. In addition, the cost for detection is reduced.

Figure 2:
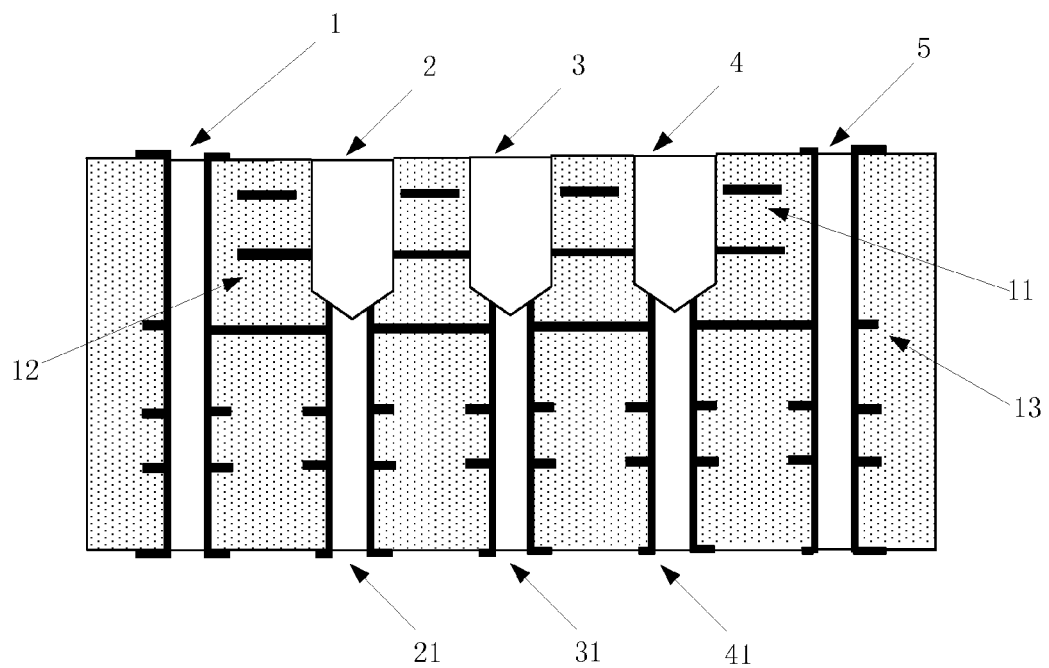
FIG. 2 is a sectional view showing a PCB panel according to embodiments of the present application.

Preferably, FIG. 2 is a sectional view illustrating the PCB panel formed according to the above embodiment. At step S11, on the first inner layer of the PCB panel, metal rings 11 with an outer diameter greater than the aperture of each of the back-drilled hole are formed according to the positions of the back-drilled holes, such as, a back-drilled hole 2, a back-drilled hole 3 and a back-drilled hole 4. The number and positions of the metal rings 11 are corresponding to those of the back-drilled holes.

Figure 3:
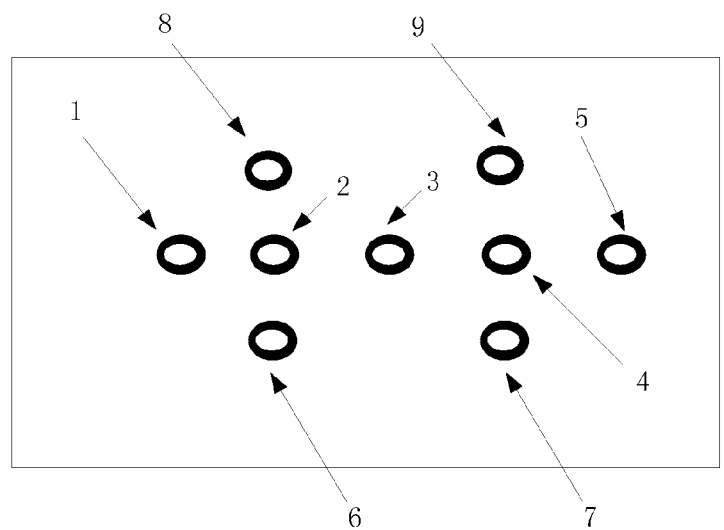
FIG. 3 is a schematic view showing the outermost layer of the PCB panel according to embodiments of the present application.

At step S12, metal holes 21, 31 and 41 are formed in the laminated PCB panel, the number and positions of which are corresponding to those of the back-drilled hole, respectively. As shown in FIG. 3, two first detection holes are formed, including a first detection hole 8 and a first detection hole 9. The first detection hole 8 is electrically connected with the metal ring corresponding to the back-drilled hole 2, and the first detection hole 9 is electrically connected with the metal ring corresponding to the back-drilled hole 4.

At step S13, the back-drilled holes 2, 3 and 4 are formed to extend through the metal rings 11. If the back-drilled holes are not aligned with their corresponding metal holes, the back-drilled holes will cause damage to the metal rings. In particular, an electrical pathway shall be formed between the two first detection holes and the back-drilled holes. If the two detection holes are not electrically conductive, it is then determined that the back-drilled holes have the position offsets from the metal holes.

Figure 4:
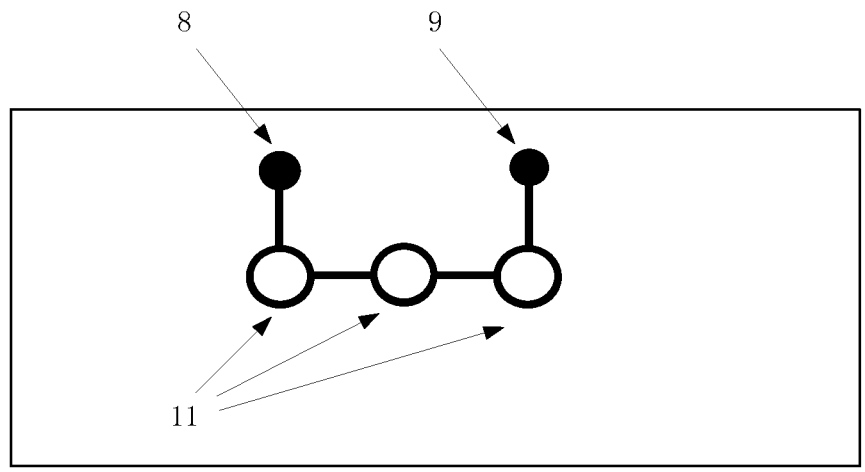
FIG. 4 is a view showing a connection structure between metal rings on a first inner layer and first detection holes of the PCB panel according to embodiments of the present application.

As shown in FIG. 4, the inner layer where the metal rings 11 are located is also referred as the first inner layer. In the first inner layer, the first and the last of three metal rings 11 are connected with the first detection holes 8 and 9, respectively. Based on the connection shown in FIG. 4, the electrical breakdown can be detected so long as one metal ring is disconnected, so that it is determined that there are misaligned back-drilled hole and the corresponding metal hole.

Preferably, the method according to the embodiment of the present application further includes the following steps.

In the process of forming the multi-layer PCB, on a metal layer of a second inner layer which is on the inside of the first inner layer in the direction of back-drilling, first bonding pads 12 with a diameter between apertures of the metal hole and the back-drilled hole are formed according to the positions of the metal holes. As seen in FIG. 2, the second inner layer is an inner layer on which the first bonding pads 12 are located.

Figure 5:
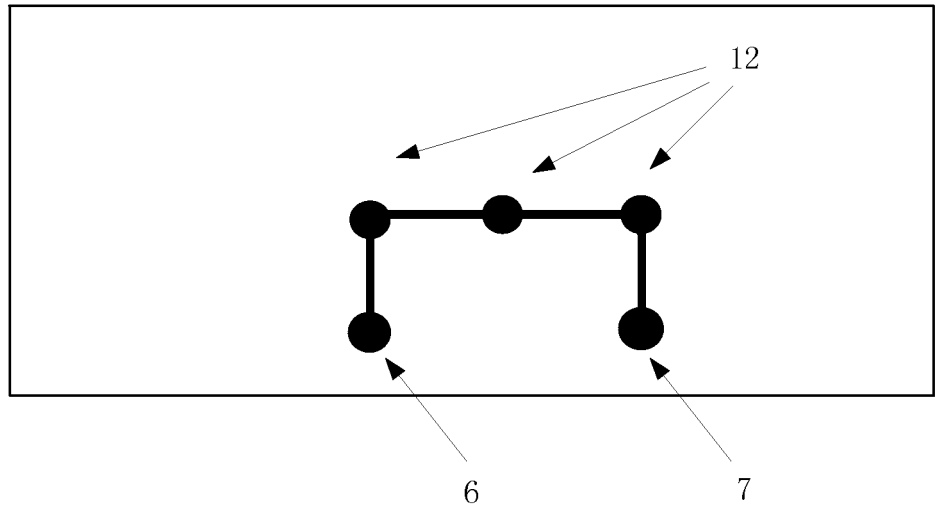
FIG. 5 is a view showing a connection structure between the first bonding pads on a second inner layer and the second detection holes of the PCB panel according to embodiments of the present application.

Two second detection holes extending from the outer layer to the second inner layer of the laminated PCB and electrically connected with the first bonding pads 12, respectively, are formed. As seen in FIG. 5, three first bonding pads 12 are connected in series, and there are two second detection holes, including a second detection hole 6 and a second detection hole 7. The first and last of the first bonding pads 12 are electrically connected with the second detection hole 6 and 7, respectively.

After the step of making the back-drilled holes, if electrical break between the two second detection holes is detected, it is determined that the back-drilled holes drill through at least one of the first bonding pads 12 on the second inner layer (the back-drilled holes have substantially the same depths due to the same set parameters thereof). The depths of the back-drilled holes meet the requirements.

If the electrical conduction between the two second detection holes is detected, then it is determined the depths of the back-drilled holes do not meet requirements.

Preferably, since the first bonding pads exist on the second inner layer, the number and positions of the formed metal holes are corresponding to those of the bonding pads.

Preferably, the method according to the embodiment of the present application further includes the following steps.

In the process of forming the multi-layer PCB, on a metal layer of a third inner layer which is on the inside of the second inner layer in the direction of back-drilling, second bonding pads 13 with a diameter between apertures of the metal hole and the back-drilled hole are formed according to the positions of the metal holes. As seen in FIG. 2, the third inner layer is an inner layer on which the second bonding pads 13 are located.

Figure 6:
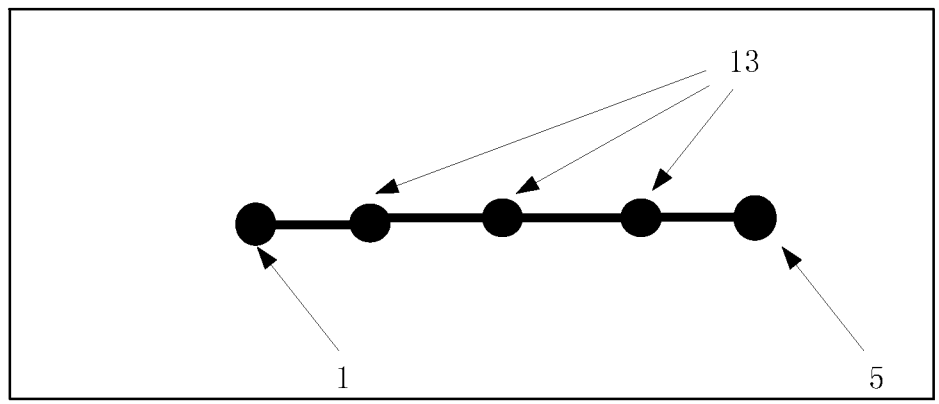
FIG. 6 is a view showing a connection structure between the second bonding pads on a third inner layer and the third detection holes of the PCB panel according to embodiments of the present application.

Two third detection holes extending from the outer layer to the third inner layer of the laminated PCB and electrically connected with the second bonding pads, respectively, are formed. As seen in FIG. 6, three second bonding pads 13 are connected in series, and there are two third detection holes, i.e. a third detection hole 1 and a third detection hole 5. The first and last of the second bonding pads 13 are electrically connected with the third detection hole 1 and 5, respectively.

After the step of forming the back-drilled holes, if the electrical conduction between the two third detection holes is detected, it denotes the back-drilled holes are not through the third inner layer, and then it is determined that the depths of the back-drilled holes meet the depth requirements.

If the electrical break between the two second detection holes is detected, which denotes that there is back-drilled hole(s) through the third inner layer, it is determined that the depths of the back-drilled holes do not meet requirements.

In the embodiment, the second inner layer is a layer which should be drilled through, and the third layer is a layer which shall not be drilled through. With the detection holes extending to the second and third inner layers, it can be detected whether the depths of the back-drilled holes meet the depth requirements.

Preferably, since the second bonding pads exist on the third inner layer, the number and positions of the formed metal holes are corresponding to those of the second bonding pads, respectively.

Preferably, in an embodiment of the present application, the difference between the outer radius of the metal ring and radius of the back-drilled hole is not greater than 6 mil. The metal ring has a width not greater than 3 mil. The difference between the radius of the bonding pad and that of the metal hole is not greater than 4 mil. Finally, the difference between the radius of the bonding pad and that of the back-drilled hole is not greater than 4 mil.

The detection structures as shown in FIG. 2 are disposed at respective corners of the PCB panel so that offsets between layers can be easily detected.

In an embodiment, a PCB panel for detecting the alignment of the back-drilled hole in the PCB is further provided, including:

a plate panel for detecting the alignment of the back-drilled hole in the PCB, including an outer layer and a first inner layer, at least one metal hole, at least one metal ring, and two first detection holes, wherein the metal hole extends through the outer layer and the first inner layer of the PCB panel, the back-drilled hole is generated by expanding the metal holes and extends into the outer layer and the first inner layer, the metal ring is disposed on the first inner layer, having position corresponding to that of the back-drilled hole and an outer diameter greater than an aperture of the back-drilled hole, the first detection holes are used for detecting the alignment between the back-drilled hole and the metal hole, and electrically connected to the metal ring, and the alignment between the back-drilled hole and the metal hole meet requirement when the two first detection holes are electrically conductive.

Preferably, the PCB panel further comprises:

a first bonding pad formed on a metal layer of a second inner layer which is on the inside of the first inner layer in the direction of back-drilling, wherein the first bonding pad has a diameter between apertures of the metal hole and the back-drilled hole and positions of the first bonding pads correspond to those of the metal hole, respectively, wherein both of the metal hole and the back-drilled hole extend through the second inner layer, and the first bonding pad is connected with two second detection holes which extend to the outer layer of the PCB, wherein the depth of the back-drilled hole is determined by detecting the electrical conduction between the first bonding pad and the second detection holes.

Preferably, the PCB panel further comprises:

a second bonding pad formed on a metal layer of a third inner layer which is on the inside of the second inner layer in the direction of back-drilling, wherein the second bonding pad has a diameter between apertures of the metal hole and the back-drilled hole, and positions of the second bonding pads correspond to those of the metal hole, respectively, wherein the metal hole extends through the third inner layer, and the second bonding pad is connected with two third detection holes which extend to the outer layer of the PCB, wherein the depth of the back-drilled hole is determined by detecting the electrical conduction between the second bonding pad and the third detection holes.

Preferably, a plurality of metal holes are provided, which are electrically connected with each other.

The number and positions of the metal ring formed on the first inner layer are corresponding to those of the metal hole, respectively. In addition, a plurality of the metal rings are electrically connected with the metal hole, wherein the first and last of the metal rings are electrically connected with one of the first detection holes, respectively.

The number and positions of the first bonding pads formed on the second inner layer are corresponding to those of the metal hole, respectively. In addition, the first bonding pad is electrically connected with the metal hole. The first and last of the metal rings are electrically connected with the second detection holes, respectively.

The number and positions of the second bonding pad formed on the third inner layer are corresponding to those of metal hole, respectively. In addition, the second bonding pad is electrically connected with each other. The first and last of the second bonding pads are electrically connected with the third detection holes, respectively.

Preferably, the difference between the outer diameter of the metal ring and the radius of the back-drilled hole is not greater than 6 mil. The metal ring has a width not greater than 3 mil. The difference between the radius of the bonding pad and that of the metal hole is not greater than 4 mil. Finally, the difference between the radius of the bonding pad and that of the back-drilled hole is not greater than 4 mil.

The above description is just preferable embodiments of the present application, and does not tend to limit the present invention. It will be apparent to those skilled in the art from consideration of the specification and practice of the present disclosure that various modifications and variations can be made to the disclosed systems and methods without departing from the scope of the disclosure, as claimed.

What is claimed is:

1. A method for detecting a back-drilled hole in a PCB, comprising:
    forming, on a metal layer of a first inner layer of a multi-layer PCB, a metal ring according to a position of a back-drilled hole to be formed during a process of forming the PCB, wherein the formed metal ring has an outer diameter greater than an aperture of the back-drilled hole to be formed;
    forming, at position corresponding to the position of the back-drilled hole to be formed, a metal hole extending through an outer layer of the PCB and the formed metal ring;
    forming two first detection holes electrically connected with the formed metal ring;
    forming the back-drilling hole on the PCB, which extends into and expand the metal hole; and
    detecting an electrical conduction between the two first detection holes so as to determine whether a position offset exists between the back-drilled hole and the metal hole.

2. The method as claimed in claim 1, further comprising:
    forming, on a metal layer of a third inner layer, second bonding pads during the process of forming the multi-layer PCB, wherein the third inner layer is inside of the first inner layer in a direction of back-drilling, and each of the formed second bonding pads has a diameter between apertures of the metal hole and the back-drilled hole;
    forming two third detection holes electrically connected with the second bonding pads;
    after forming the back-drilled holes, if said two third detection holes are detected to be electrically conductive, it will be determined that depths of the back-drilled holes meet requirements; otherwise, it will be determined that the depths of the back-drilled do not meet requirements.

3. The method as claimed in claim 2, further comprising:
    forming, on a metal layer on a second inner layer between the first inner layer and the third inner layer, a first bonding pad having a diameter between apertures of the metal hole and the back-drilled hole during the process of forming the multi-layer PCB, wherein position of the formed first bonding pad corresponds to that of the metal hole;
    forming two second detection holes electrically connected with the first bonding pad;
    after forming the back-drilled hole, if the electrical break between the two second detection holes is detected, it will be determined the depth of the back-drilled hole extends beyond the second inner layer; otherwise it will be determined the depth of the back-drilled hole does not extend beyond the second inner layer.

4. The method as claimed in claim 1,
    wherein,
    a plurality of metal rings electrically connected with each other are formed,
    the number and positions of the metal rings formed on the first inner layer are corresponding to those of the metal hole, respectively,
    the metal rings are connected in series, and
    the first and last of the metal rings are electrically connected with one of the first detection holes, respectively.

5. A PCB panel having a back-drilled hole, comprising:
    an outer layer and a first inner layer;
    at least one metal hole, at least one metal ring, and two first detection holes, wherein
    the metal hole extends through the outer layer and the first inner layer of the PCB panel;
    the back-drilled hole is generated by expanding the metal hole and extends into the outer layer and the first inner layer;
    the metal ring is arranged on the first inner layer, and has a position corresponding to that of the back-drilled hole and has an outer diameter greater than the aperture of the back-drilled hole; and
    the first detection holes are arranged to detect alignments between the back-drilled hole and the metal hole, and electrically connected with the metal ring, and
    wherein the alignments between the back-drilled hole and the metal hole meet requirements if the two first detection holes are electrically conductive.

6. The PCB panel as claimed in claim 5, wherein the first detection holes are disposed on the outer layer of the PCB panel.

7. The PCB panel as claimed in claim 5, wherein the difference between an outer diameter of the metal ring and a radius of the back-drilled hole is not greater than 6 mil, and the metal ring has a width not greater than 3 mil.

8. The PCB panel as claimed in claim 5, further comprising:
    a third inner layer, a second bonding pad attached to a metal layer on the third inner layer, and
    two third detection holes,
    wherein,
    the third inner layer is disposed on an inside of the first inner layer in the direction of back-drilling;
    the second bonding pad has a position corresponding to that of the back-drilled hole, and a diameter between apertures of the metal hole and the back-drilled hole;
    the metal hole extends through the third inner layer; and
    the third detection holes are arranged to detect a depth of each back-drilled hole, and electrically connected with the second bonding pad, wherein the depth of the back-drilled hole meets requirements if the two third detection holes are electrically conductive.

9. The PCB panel as claimed in claim 5, wherein there are a plurality of metal rings electrically connected with each other, and there are provided a plurality of metal holes,
    the number and positions of the metal rings formed on the first inner layer are corresponding to those of the metal holes,
    the metal rings are electrically connected in series, and
    the first and last of the metal holes are electrically connected with the two first detection holes, respectively.

10. The PCB panel as claimed claim 8, wherein
a difference between a radius of the second bonding pad and a radius of the metal hole is not greater than 4 mil; and
a difference between a radius of the second bonding pad and a radius of the metal hole is not greater than 4 mil.

11. The method as claimed in claim 2, wherein,
a plurality of metal rings electrically connected with each other are formed,
the number and positions of the metal rings formed on the first inner layer are corresponding to those of the metal hole, respectively,
the metal rings are connected in series, and
the first and last of the metal rings are electrically connected with one of the first detection holes, respectively.

12. The method as claimed in claim 3, wherein,
a plurality of metal rings electrically connected with each other are formed,
the number and positions of the metal rings formed on the first inner layer are corresponding to those of the metal hole, respectively,
the metal rings are connected in series, and
the first and last of the metal rings are electrically connected with one of the first detection holes, respectively.

* * * * *